(12) United States Patent
Chochos et al.

(10) Patent No.: US 7,854,862 B2
(45) Date of Patent: Dec. 21, 2010

(54) MULTIFUNCTIONAL MATERIALS CONSISTING OF REGIOREGULAR POLY(3-ALKYLTHIOPHENE)S COVALENTLY ATTACHED ON CARBON NANOTUBES FOR PHOTOVOLTAIC APPLICATIONS

(75) Inventors: Christos Chochos, Kerkyra (GR); Joannis Kallitsis, Patras (GR)

(73) Assignee: Advent Technologies, Athens (GR)

( * ) Notice: Subject to any disclaimer, the term of this patent is extended or adjusted under 35 U.S.C. 154(b) by 79 days.

(21) Appl. No.: 12/190,676

(22) Filed: Aug. 13, 2008

(65) Prior Publication Data
US 2009/0085012 A1    Apr. 2, 2009

Related U.S. Application Data

(60) Provisional application No. 60/995,832, filed on Sep. 27, 2007.

(51) Int. Cl.
*H01B 1/06* (2006.01)
(52) U.S. Cl. .................. 252/511; 252/500; 252/510; 423/447.1; 423/447.2; 524/496; 977/742; 977/745; 977/746; 977/750; 977/752; 977/842; 977/847

(58) Field of Classification Search ......... 252/500–511; 427/212–22; 423/447.1, 447.2; 524/596; 977/742, 745, 746, 750, 752, 842, 847
See application file for complete search history.

(56) References Cited

U.S. PATENT DOCUMENTS

| | | | |
|---|---|---|---|
| 2006/0081882 A1* | 4/2006 | Malenfant et al. | 257/203 |
| 2008/0191198 A1* | 8/2008 | Han et al. | 257/40 |
| 2008/0234424 A1* | 9/2008 | Lee et al. | 524/495 |

OTHER PUBLICATIONS

Wang et al. (Polymers containing fullerene or carbon nanotube structures. Prog. Polym. Sc. vol. 29, pp. 1079-1141, Oct. 2004).*
Pradhan et al. ("Functionalized carbon nanotubes in donor/acceptor-type photovoltaic devices." App. Phys. Let. vol. 88, pp. 093106-1 to 3, Feb. 2006).*

* cited by examiner

*Primary Examiner*—Mark Kopec
*Assistant Examiner*—Tri V Nguyen
(74) *Attorney, Agent, or Firm*—Konstantina M. Katcheves; Saul Ewing LLP

(57) ABSTRACT

Facile ways towards the integration of the regioregular poly (3-alkylthiophene)s onto carbon nanotubes, providing multifunctional materials that combine the extraordinary properties of the carbon nanotubes with those of regioregular poly (3-alkylthiophene)s, are presented.

4 Claims, 5 Drawing Sheets

Figure 5

MULTIFUNCTIONAL MATERIALS CONSISTING OF REGIOREGULAR POLY(3-ALKYLTHIOPHENE)S COVALENTLY ATTACHED ON CARBON NANOTUBES FOR PHOTOVOLTAIC APPLICATIONS

FIELD OF INVENTION

This invention is related to the synthesis of new multifunctional materials consisting of regioregular poly(3-alkylthiophene)s covalently attached on single wall or multi wall carbon nanotubes with two different ways. These materials are easy processable from common organic solvents while at the same time combine the properties of the regioregular poly(3-alkylthiophene)s with those of single wall or multi wall carbon nanotubes. In addition, an efficient electron transfer from the regioregular poly(3-alkylthiophene) to the single wall or multi wall carbon nanotube is exhibited, based on the study of their optical properties.

BACKGROUND INFORMATION

The discovery of photoinduced electron transfer between conjugated polymers and fullerene ($C_{60}$) (Sariciftci, Wudl et al. 1992) and the optimized photovoltaic devices (~6.0% power conversion efficiency) fabricated from regioregular poly(3-hexylthiophene)s (rrP3HTs) and soluble derivative of fullerene (PCBM) (Kim, Carroll et al. 2007), opened new ways for the realization of flexible photovoltaics based on semiconducting polymers (Seyte, Camps et al. 1985; Savechika, Yamamoto et al. 1985). The demand for further optimization of the photovoltaic efficiency has stimulated an intensive research effort both for new low band gap polymeric materials, acting as electron donors, but also for new efficient electron accepting materials.

In the last case, carbon nanotubes (CNTs) have gained interest as an alternative to the fullerene derivatives, because of their dimensions which enable the transport of the charge along the axis of the nanometers-long carbon structure and can contribute to a reduced probability of back transfer to the oxidized electron donor polymer. The first report of a polymer:single wall carbon nanotube (SWNT) photovoltaic device was in 2002 (Kymakis and Amaratunga 2002), utilizing composites of SWNTs with regioregular poly(3-octylthiophene) (rrP3OT). Ever since, many efforts have been presented towards the fabrication of CNTs-based photovoltaic devices (Guldi, Ford et al. 2005; Sgobba, Prato et al. 2006). However, limited power conversion efficiencies were found. Thus, several obstacles need to be properly addressed, such as the processability of the nanotubes and the selection of a proper set of electron donors to facilitate higher power conversion efficiencies from such photovoltaic devices.

The initial disadvantage of poor solubility has been partially overcome by various functionalization techniques (Tasis, Prato et al. 2006) using either the covalent attachment (Chen, Haddon et al. 1998) of different organic groups through reactions onto the 7-conjugated backbone of the SWNTs or the noncovalent absorption (Chen, Walker et al. 2002) or wrapping of various functional polymers (Richard, Mioskowski et al. 2003). Grafting to (Mansky, Hawker et al. 1997) or grafting from (Zhao and Brittain 2000) techniques have also been used for the conventional polymer modification of nanotubes. In order to prevent the 1-conjugation disruption, various modifications (Campidelli, Prato et al. 2006) that allow the weak functionalization of the SWNTs resulting in the lowest possible distortion of their electronic properties, can be used.

SUMMARY OF THE INVENTION

We present the synthesis of easy processable multifunctional materials consisting of regioregular poly(3-alkylthiophene)s (rrP3ATs) covalently attached to single wall or multi wall carbon nanotubes. Using properly mono-functionalized regioregular poly(3-alkylthiophene) (rrP3AT), we target their direct attachment onto the single wall carbon nanotube surface with two different synthetic routes. The choice of rrP3ATs was made due to their superior optoelectronic properties and chemical stability and the improved processability of the synthesized materials because of the long alkyl chains. Investigation of the optical properties of the materials was performed by means of UV-Vis and photoluminescence spectroscopy. An efficient electron transfer occurs from the rrP3AT to the SWNT based on the observed complete photoluminescence quenching. This is a first indication that these multifunctional materials fulfill the prerequisites as promising candidates for photovoltaic applications.

BRIEF DESCRIPTION OF THE DRAWINGS

For a fuller understanding of the nature and desired objects of the present invention, reference is made to the following detailed description taken in conjunction with the accompanying drawing figures wherein.

DEFINITIONS

The following definitions are for convenient reference with respect to the following description and are not to be construed in a limiting manner.

The term Gel Permeation Chromatography ("GPC") shall be understood to mean or refer to a method or technique used in order to determine the molecular weight (Mn and Mw) and dispersity of the polymers.

The term Nuclear Magnetic Resonance ("NMR") shall be understood to mean or refer to a method or technique used in order to identify the chemical and molecular structure of the polymers and the proportion of the monomers in the copolymers.

The term Thermogravimetric Analysis ("TGA") shall be understood to mean or refer to a method or technique used in order to study the thermal stability.

The term Fourier Transform Infrared Spectroscopy ("FT-IR") shall be understood to mean or refer to a method or technique used in order to identify the chemical structure of the materials.

The term Ultraviolet Visible ("UV-Vis") shall be understood to mean or refer to a method or technique used in order to study the optical property.

DETAILED DESCRIPTION OF THE INVENTION

Synthesis of Multifunctional Materials

The present invention relates to the development and characterization of new multifunctional materials (structures 1 and 2) comprising regioregular poly(3-alkylthiophene)s covalently attached on single or multi wall carbon nanotubes. The structures of the materials are given below.

For the purpose of the present invention, monofunctionalized regioregular poly(3-alkylthiophene)s having octyl side chain group and single wall carbon nanotubes are preferable.

The first goal of this invention is the preparation of one-end functionalized regioregular poly(3-octylthiophene) having phenol as terminal group. Our approach is a two-step process slightly different from an already reported procedure (Jeffries-E L, McCullough et al. 2005; Sheina, McCullough et al. 2006) for the end-functionalization of regioregular poly(3-alkylthiophene)s, in order to avoid the synthesis of difunctionalized phenol terminated regioregular poly(3-alkylthiophene)s.

Figure 1:
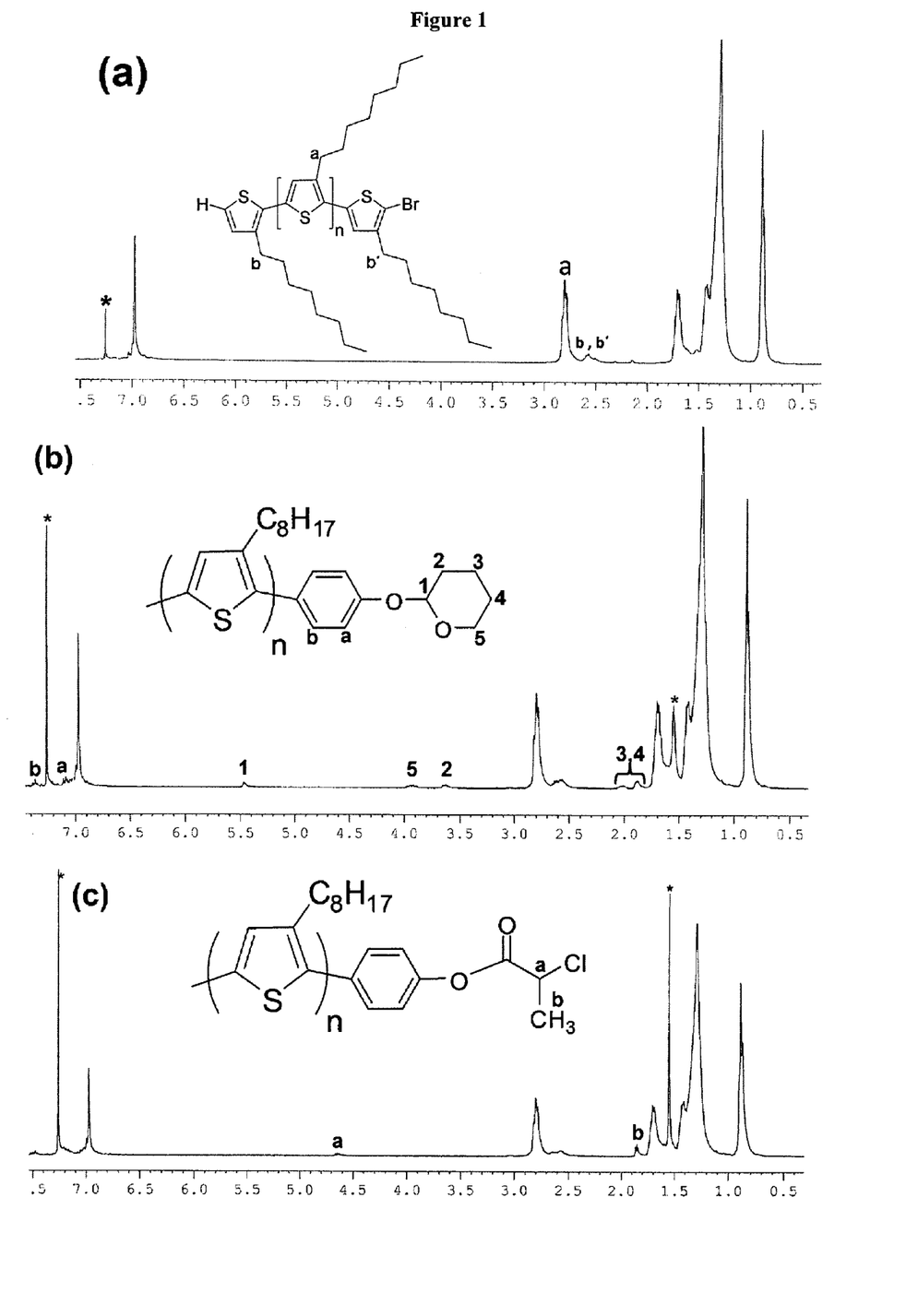
FIG. 1 $^1$H NMR spectra of (a) rrP3OT (1), (b) phenoxy-tetrahydropyranyl terminated rrP3OT (2) and (c) rrP3OT macroinitiator (6). The asterisk denotes the solvent used ($CDCl_3$)

First, we synthesized and isolated the H/Br terminated rrP3OT (1) according to (Iovu, McCullough et al. 2005; Loewe and McCullough 2000; Miyakoshi, Yokozawa et al. 2005). The $^1$H NMR spectrum of rrP3OT (1) is presented in FIG. 1a, which allows the accurate determination of the molecular weight of rrP3OT (1) based on the integration of the peak at 2.8 ppm, assigned to the a-methylene protons of the octyl groups and the broad peak at 2.6-2.5 ppm, assigned to the methylene protons on the first carbon substituent (b and b') on the end units. For example, the number of the repeat units n for the rrP3OT (1) is equal to 13, corresponding to $M_n$=2600. This molecular weight is lower than that obtained from the GPC measurements ($M_n$~4350). Afterwards, a palladium-mediated Suzuki coupling reaction (Miyaura and Suzuki 1995) was performed between rrP3OT (1) and (tetrahydropyranyloxy)phenyl boronic acid (M1), for the preparation of the phenoxy-tetrahydropyranyl terminated rrP3OT (2). The $^1$H NMR spectrum of phenoxy-tetrahydropyranyl terminated rrP3OT (2) is depicted in FIG. 1b. The characteristic peaks of the tetrahydropyranyl-protecting group as well as two small doublet peaks are clearly observed at δ~7.4 and 7.1 ppm respectively, assigned to the phenyl ring. Verification of the monofunctionalization of the rrP3OT (1) was also confirmed from the $^1$H NMR spectrum of FIG. 1b. Based on the peak at 1.9 ppm assigned to the protons of the tetrahydropyranyl group and the peak at 0.9 ppm assigned to the methyl protons of the octyl group, a polymerization degree of 15 repeating units was obtained for this polymer, in close proximity to the DPn=13 obtained for the H/Br rr-P3OT (1). Finally, hydrolysis of phenoxy-tetrahydropyranyl terminated rrP3OT (2) with hydrochloric acid 37% afforded the phenol-terminated rrP3OT (3) in quantitative yields.

Figure 2:
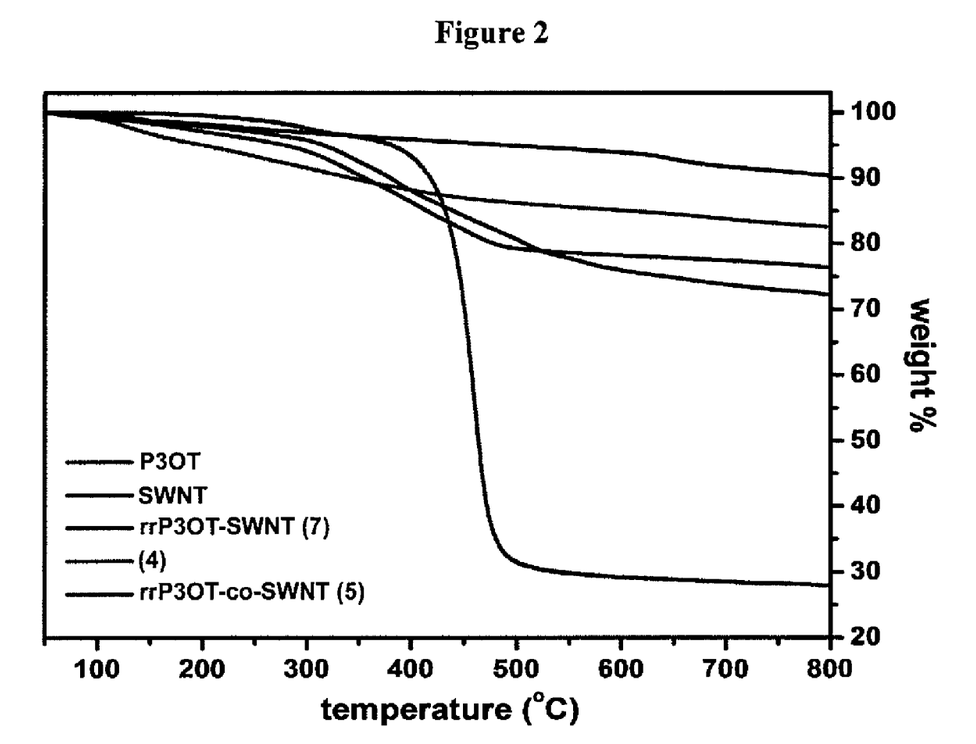
FIG. 2 TGA of pristine single wall carbon nanotube (SWNT), the rrP3OT (1), the nanotube derivative (4), the rrP3OT-co-SWNT (5) and the rrP3OT-SWNT (7) (10° C./min under nitrogen atmosphere)

The reaction of pristine SWNTs in the presence of 2-aminoethanol in DMF led to the synthesis of nanotube derivative (4) that has free hydroxyl groups in the periphery of the SWNT. The direct reaction of amino derivatives onto the carbon nanotube surface has been described in the literature (Basiuk, Basiuk et al. 2004) and is an easy method of providing functionalized carbon nanotube materials. Based on the TGA results of FIG. 2, the pristine SWNT and nanotube derivative (4) present a loss of weight of about 8% and 17.5% at 800° C., respectively. This corresponds to the presence of one functional hydroxy-terminated group per 60 carbon atoms. Decoration of the modified SWNT (4) with the phenol-terminated rrP3OT (3) was accomplished by an ether bond formation in the presence of triphenylphosphine (TPP) and diisopropylazodicarboxylate (DIAD) (Mitsunobu 1981), providing the regioregular poly(3-octylthiophene) modified single wall carbon nanotube (rrP3OT-co-SWNT) (5). The amount of the polymer chemically bonded onto nanotube derivative (4) was evaluated by TGA (FIG. 2). The aminoethanol modified SWNT (4) show very good thermal stability up to 800° C. under an inert nitrogen atmosphere, while the presence of the grafted polymer onto nanotube derivative (4) is verified by the polymer decomposition occurring in this temperature range. TGA measurements demonstrated that approximately 11 wt % of the rrP3OT-co-SWNT (5) is due to the polythiophene precursor. Taking into account that the molecular weight of the polymer is equal to 2600, the functionalization percentage of rrP3OT-co-SWNT (5) was estimated to be approximately 0.12%. A simple calculation permits a functionalization percentage of 1.9% if all the hydroxyl groups of nanotube derivative (4) are connected to the phenol-terminated rrP3OT (3). This indicates that not all the hydroxyl groups of the nanotube derivative nanotube derivative (4) have reacted with the phenol group of (3), and we estimate that there is an average of one regioregular polythiophene chain per 17 aminoethanol groups.

In the second synthetic route, esterification of the free phenol of (3) with 2-chloropropionyl chloride end up with the desired regioregular poly(3-octylthiophene) macroinitiator (6). The $^1$H NMR spectrum of (6) is depicted in FIG. 1c. The disappearance of the characteristic signals of the tetrahydropyranyl protecting group and the subsequent appearance of a multiple peak are clearly observed at δ~4.6 ppm and at δ~1.8 ppm respectively, which are assigned to the terminal proton next to the halogen atom and to methyl protons next to the terminal proton of the chloropropionyl group, respectively. Verification of the polymerization degree of the rrP3OT (1) was also confirmed from the $^1$H NMR spectrum of FIG. 1c. Based on the methyl protons of the chloropropionyl group and the methyl protons of the octyl group, a polymerization degree of 15 repeating units was obtained for this polymer, similar to the DPn=15 obtained for the phenoxy-tetrahydropyranyl terminated rrP3OT (2). One method of introducing the fullerene into polymer backbone was through atom transfer radical polymerization conditions as described in the literature (Zhou, Li et al. 2000; Chochos, Gregoriou et al. 2005). By employing similar reaction conditions between regioregular poly(3-octylthiophene) macroinitiator (6) and SWNT, we succeeded in synthesizing the regioregular poly(3-octylthiophene) modified single wall carbon nanotube (rrP3OT-SWNT) (7). The amount of the polymer grafted onto the surface of the SWNT was estimated by TGA (FIG. 2). TGA measurements demonstrated that approximately 15 wt % of the rrP3OT-SWNT (7) is due to the polythiophene chains corresponding to a functionalization percentage equal to 0.09%.

Figure 3:
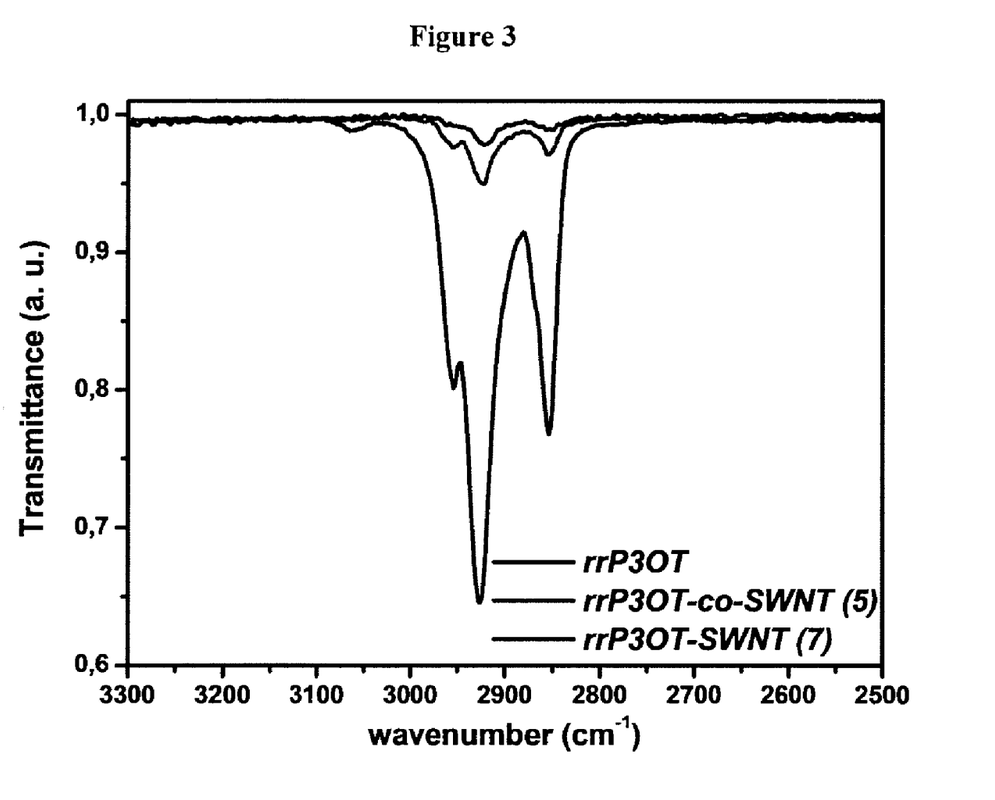
FIG. 3 FT-IR spectra of rrP3OT (1), rrP3OT-co-SWNT (5) and rrP3OT-SWNT (7) in the 3300-2500 $cm^{-1}$ spectra region.

FT-IR characterization was also used to verify the introduction of the rrP3OT precursor onto the SWNT surface both for materials rrP3OT-co-SWNT (5) and rrP3OT-SWNT (7). The spectrum of rrP3OT (1) show peaks at 2926 cm$^{-1}$ and at 2853 cm$^{-1}$ assigned to the methyl and methylene protons of the octyl side chain group (FIG. 3), while the IR spectra of materials rrP3OT-co-SWNT (5) and rrP3OT-SWNT (7) demonstrate similar peaks at 2926 cm$^{-1}$ and at 2853 cm$^{-1}$, respectively (FIG. 3).

Figure 4:
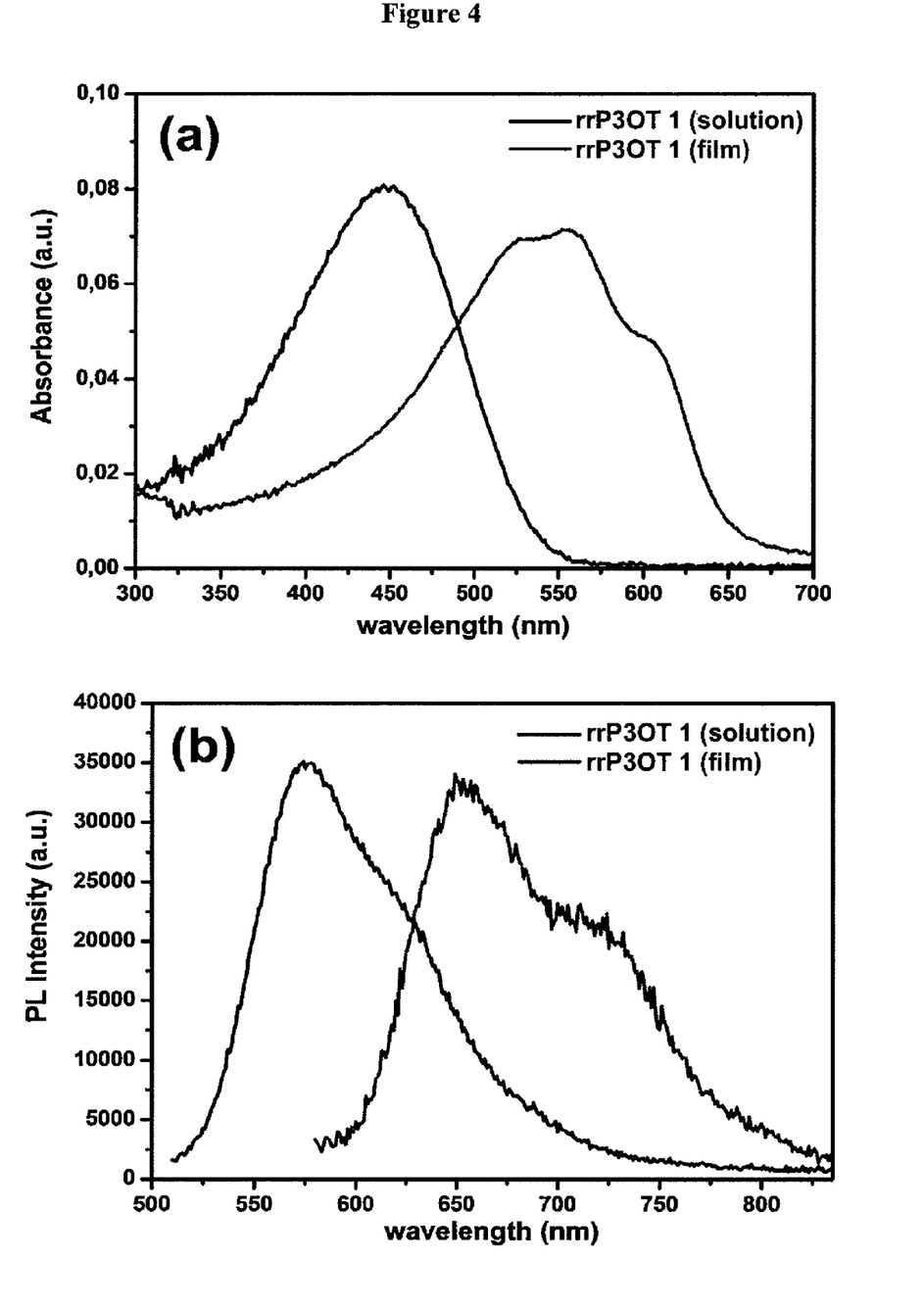
FIG. 4 a) UV-Vis absorption and b) photoluminescence spectra of rrP3OT (1), both in solution and in solid state.

The UV-Vis and emission spectra of rrP3OT (1), both in solution and solid state, are shown in FIG. 4. The UV-Vis spectra of rrP3OT (1) reveal an absorption maximum at 440 nm in solution and at 512, 554 and 606 nm in the solid state (FIG. 4a), characteristic of the rrP3ATs (Rieke 1994; Rieke 1998). In addition, the photoluminescence spectra of rrP3OT (1) exhibit two electronic transitions at 572 and 620 nm in solution and at 650 and 715 nm in the solid state, respectively (FIG. 4b).

Figure 5:
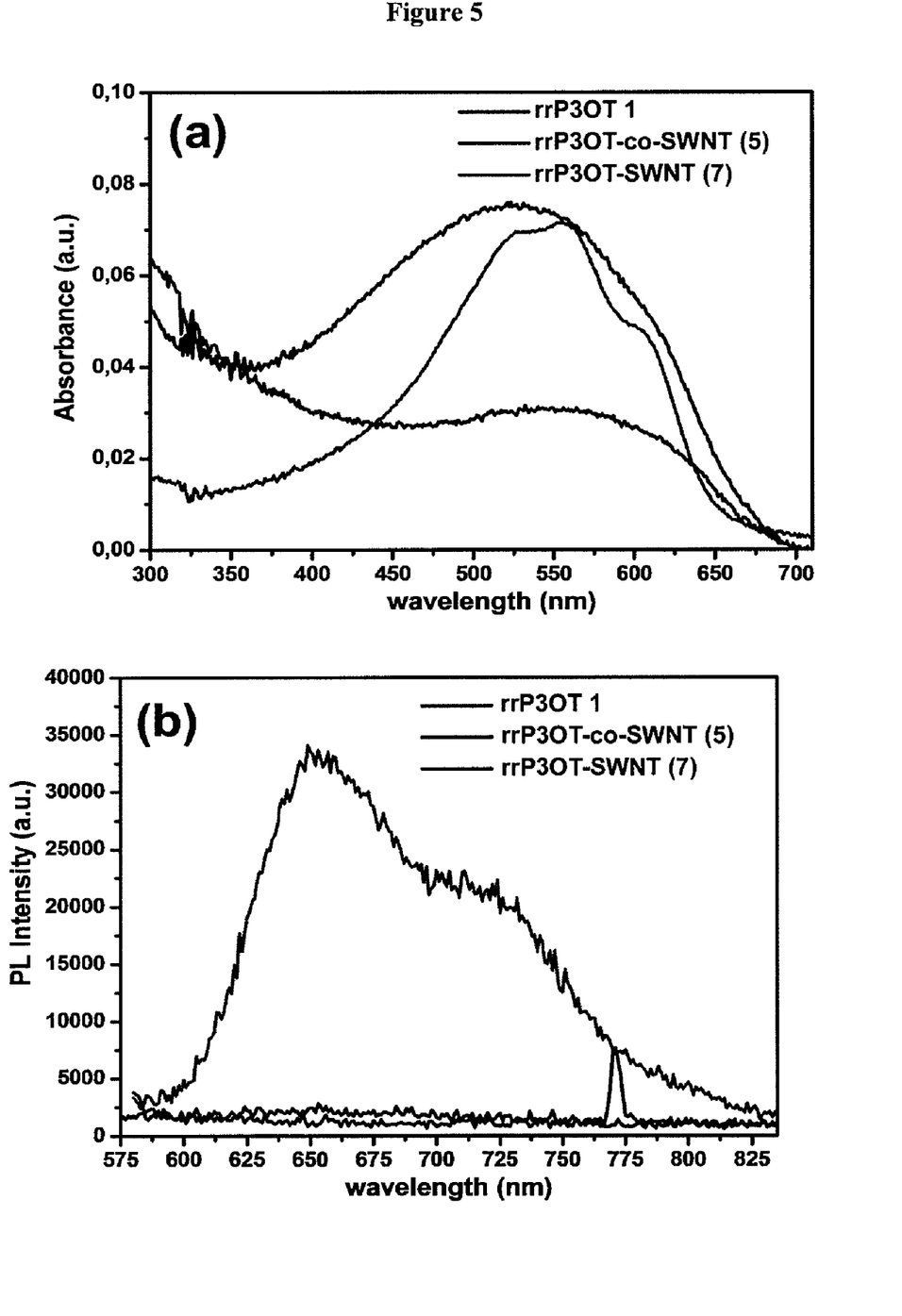
FIG. 5 a) UV-Vis and b) photoluminescence spectra of rrP3OT (1), rrP3OT-co-SWNT (5) and rrP3OT-SWNT (7) in the solid state.

The UV-vis spectra of rrP3OT-co-SWNT (5) and rrP3OT-SWNT (7) in the solid state are shown in FIG. 5a. Strong evidence for the efficient incorporation of the polythiophene precursor onto the SWNT ensue from the corresponding absorption spectra. Although SWNTs do not show any absorption band between 400 and 700 nm in the solid state, the rrP3OT-co-SWNT (5) and rrP3OT-SWNT (7) demonstrate a broad absorption band between 400 and 700 nm assigned to the rrP3OTs. Furthermore, it is shown that the absorption spectra of the rrP3OTs are less resolved when are integrated onto the SWNT, in contrast to the regioregular polythiophene precursor. In addition, comparing the emission spectra of the rrP3OT-co-SWNT (5) or rrP3OT-SWNT (7) in the solid state, with those of the rrP3OT thin film, one can see that although the absorption spectra are adjusted to almost the same absorption value, the emission from the rrP3OT-co-SWNT (5) or the rrP3OT-SWNT (7) is totally quenched (FIG. 5b). This is a strong indication of an efficient electron transfer from the excited polythiophene chains to the SWNT backbone showing that this type of modification does not disturb in a large extent the electronic properties of the SWNT.

The following non-limiting examples are illustrative of the invention. All documents mentioned herein are incorporated herein by reference.

EXAMPLE 1

Synthesis of H/Br Regioregular poly(3-octylthiophene) (1)

One of the synthetic procedures which is followed for the synthesis of the H/Br regioregular poly(3-octylthiophene) (1) is given below.

To a suspension of magnesium (4.72 g, 196.32 mmol) in 120 mL of anhydrous diethyl ether, the octylbromide (29.6 mL) in 30 mL of diethyl ether was added dropwise. After complete disappearance of magnesium, 3-bromothiophene (20 g, 122.7 mmol) and 1,3-diphenylphosphinopropane nickel(II) chloride (Ni(dppp)Cl$_2$) (0.33 g, 0.6135 mmol) were added. After stirring and heating for 48 h, the reaction mixture was poured into a mixture of crushed ice and diluted HCl (2N) and extracted from ether. The combined ether layers were dried over MgSO$_4$. After removal of the solvent, the residue was purified by column chromatography using hexane as eluent. The 3-octylthiophene was received as colorless oil (16.1 μg, 67% yield).

$^1$H-NMR (CDCl$_3$): δ=7.21 (m, 1H), 6.88 (m, 2H), 2.55 (t, 2H), 1.54 (m, 2H), 1.25 (m, 10H), 0.92 (t, 3H).

3-octylthiophene (9.8 g, 0.05 mol) was solubilized in 30 mL of dimethylformamide (DMF) under argon in the dark. N-bromosuccinimide (NBS) (17.8 g, 0.1 mol) was added portionwise. The resulting solution was stirred at room temperature under argon overnight. Sodium sulfite (Na$_2$SO$_3$) (30 mL) was then added in order to remove the impurities of succinimide, and the organic phase was extracted with diethyl ether (100 mL) twice, washed with water and dried with magnesium sulfate. The solvent was removed under reduced pressure to obtain the 2,5-dibromo-3-octylthiophene (15.6 g) as a yellow oil in 88% yield.

$^1$H-NMR (CDCl$_3$): δ=6.75 (s, 1H), 2.52 (t, 2H), 1.52 (m, 2H), 1.28 (t, 10H), 0.89 (t, 3H).

2,5-dibromo-3-octylthiophene (7.08 g, 0.02 mol) was dissolved in 100 mL of anhydrous tetrahydrofuran (THF). To this solution was added via a syringe isopropylmagnesium chloride (10 mL, 2.0 M in tetrahydrofuran) and the mixture was refluxed for 3 h. The reaction mixture was then allowed to cool to room temperature and 1,3-diphenylphosphinopropane nickel(II) chloride (Ni(dppp)Cl$_2$) (0.11 g, 0.0002 mol) was added in one portion. The mixture was refluxed for another 24 h and then poured into methanol to precipitate the polymer. The polymer was filtered and then washed by Soxhlet extraction with methanol, acetone, hexane and chloroform. The H/Br regioregular poly(3-octylthiophene) (2.7 g) was received from the chloroform extraction.

$^1$H-NMR (CDCl$_3$): δ=6.97 (s, 1H), 2.80 (t, 2H), 1.70 (m, 2H), 1.29 (m, 10H), 0.88 (d, 3H).

$^{13}$C-NMR (CDCl$_3$): δ=140.30, 134.11, 130.89, 129.01, 32.29, 30.93, 29.97, 29.84, 29.69, 23.07, 14.49

EXAMPLE 2

Synthesis of Phenol-Terminated Regioregular poly(3-octylthiophene) (3)

One of the synthetic procedures which is followed for the synthesis of the phenol-terminated regioregular poly(3-octylthiophene) is given below.

Regioregular poly(3-octylthiophene) (1) (1 g), (tetrahydropyranyloxy)phenyl boronic acid (M1) (1.211 g, 5.454 mmol) and 126 mg of tetrakis(triphenylphosphine)palladium [Pd(PPh$_3$)$_4$] were placed together in a reaction flask. The flask was degassed and filled with argon several times. THF (100 mL) and 2M Na$_2$CO$_3$ (6.1 mL) were added and the mixture was heated at reflux for 48 h under argon atmosphere. The solvent was partially removed under reduced pressure and the mixture was poured into methanol to precipitate the crude polymer. The polymer was filtered and then washed by Soxhlet extraction with methanol, acetone (in order to remove the excess of (M1)) and chloroform. The phenoxy-tetrahydropyranyl terminated rrP3OT (2) (0.91 g) was collected from the chloroform extraction.

$^1$H NMR (400 MHz, CDCl$_3$): δ$_H$ 0.88 (t, 45H), 1.31 (m, 120H), 1.42 (m, 30H), 1.70 (t, 30H), 1.88 (b, 2H), 2.01 (b, 2H), 2.81 (t, 30H), 3.63 (m, 2H), 3.94 (m, 2H), 5.47 (s, 1H) 6.99 (s, 15H), 7.11 (d, 2H), 7.34 (d, 2H); GPC: M$_n$: 4820, PDI: 1.6; $^1$H NMR: DPn=15, M$_n$: 3088.

In a round-bottom flask the phenoxy-tetrahydropyranyl terminated rrP3OT (2) was dissolved in THF (50 mL). The mixture was heated to reflux and then 6 drops of HCl 37% were added. The reaction was heated overnight and then precipitated into methanol. The polymer was filtered, washed with deionized water and methanol and dried in vacuum. The phenol-terminated regioregular poly(3-octylthiophene) (3) was afforded in quantitative yield.

$^1$H NMR (400 MHz, CDCl$_3$): δ$_H$ 0.88 (t, 45H), 1.28 (m, 120H), 1.41 (m, 30H), 1.70 (t, 30H), 2.80 (t, 30H), 6.99 (s, 15H), 7.07 (d, 2H), 7.26 (d, 2H); GPC: M$_n$: 4760, PDI: 1.6; $^1$H NMR: DPn=15, M$_n$: 3004.

EXAMPLE 3

Synthesis of Aminoethanol Modified Single Wall Carbon Nanotube (4)

The reaction which is followed for the synthesis of the aminoethanol modified single wall carbon nanotube is given below.

A suspension of pristine SWNTs (50 mg) in DMF (50 mL) was sonicated for 10 min and then the 2-aminoethanol (3 mL, 49.8 mmol) was added. The reaction mixture was stirred at 80° C. for 5 days, then filtered through a Millipore membrane (PTFE, 0.22 μm), washed with DMF, dichloromethane and diethyl ether and dried under high vacuum affording 35 mg of the nanotube derivative (4).

EXAMPLE 4

Synthesis of Regioregular poly(3-octylthiophene) Modified Single Wall Carbon Nanotube (5)

The reaction which is followed for the synthesis of the regioregular poly(3-octylthiophene) modified single wall carbon nanotube (rrP3OT-co-SWNT) is given below.

Phenol-terminated rrP3OT (3) (22 mg), the aminoethanol modified SWNT (4) (15 mg) and triphenylphosphine (TPP) (20.06 mg, 0.076 mmol) were added in a previously degassed round-bottom flask. DMF (10 mL) and THF (10 mL) were placed in the reaction flask and sonicated for 15 min. Diisopropylazodicarboxylate (DIAD) (15 μL, 0.076 mmol) was then added in the reaction mixture and the flask was degassed and filled with argon several times. The reaction was stirred at 80° C. for 24 h under argon atmosphere. Then, the same amount of TPP and DIAD was placed in the flask and the mixture allowed reacting at 80° C. for another 24 h under argon atmosphere. After being cooled to room temperature, the suspension was sonicated and centrifugated in order to remove any unreacted nanotube derivative (4). The solution was filtered through a Millipore membrane (PTFE, 0.22 μm), and the brownish solid was washed several times with DMF, chloroform (in order to remove any excess of phenol-terminated rrP3OT (3)) and diethyl ether, affording 32 mg of the compound regioregular poly(3-octylthiophene) modified single wall carbon nanotube (5) (rrP3OT-co-SWNT).

FT-IR (KBr): ν (cm$^{-1}$) 2926, 2853

EXAMPLE 5

Synthesis of Regioregular poly(3-octylthiophene) Macroinitiator (6)

The reaction which is followed for the synthesis of the regioregular poly(3-octylthiophene) macroinitiator (6) is given below.

In a degassed round-bottom flask, 195 mg of phenol-terminated rrP3OT (3) was added and dissolved in distilled dichloromethane (30 mL). The polymer solution was cooled to 0° C. Chloropropionylchloride (CPC) (0.22 mL) and distilled triethylamine (Et$_3$N) (70 μL) were added in the reaction and after 10 min the mixture was heated at 80° C. for 24 h. Then the mixture was cooled to 0° C. and the same amount of CPC and Et$_3$N were added. After 10 min the mixture was heated at 80° C. for 24 h. This procedure was repeated, and the final mixture was left to react at 80° C. for 48 h. Finally an excess of MeOH was added in the flask and the mixture was stirred for 1 h. The mixture was filtered, and the resulting initiator was washed with MeOH repeatedly and subsequently dried affording regioregular poly(3-octylthiophene) macroinitiator (6) in quantitative yield.

$^1$H NMR (400 MHz, CDCl$_3$): δ$_H$ 0.88 (t, 45H), 1.28 (m, 120H), 1.41 (m, 30H), 1.70 (t, 30H), 1.84 (dd, 3H), 2.81 (t, 30H), 4.64 (m, 1H), 6.99 (s, 15H), 7.04 (d, 2H), 7.20 (d, 2H); GPC: M$_n$: 4870, PDI: 1.7; $^1$H NMR: DPn=15, M$_n$: 3091.5.

EXAMPLE 6

Synthesis of Regioregular poly(3-octylthiophene) Modified Single Wall Carbon Nanotube (7)

The reaction which is followed for the synthesis of the regioregular poly(3-octylthiophene) modified single wall carbon nanotube (7) is given below.

The regioregular poly(3-octylthiophene) macroinitiator (6) (30 mg), CuBr (6.66 μmol), and bpy (13.13 μmol) were placed in a reaction flask, degassed and filled with argon three times. Next, o-dichlorobenzene (8 mL) and SWNT (30 mg) were added in the reaction flask and sonicated for 15 min. Then, the reaction mixture was heated at 110° C. for 3d. After being cooled to room temperature, the suspension was sonicated and centrifugated in order to remove any unreacted SWNT. The solution was filtered through a Millipore membrane (PTFE, 0.22 μm), and the brownish solid was washed several times with DMF, THF (in order to remove any unreacted of regioregular poly(3-octylthiophene) macroinitiator (6)) and diethyl ether, affording 31 mg of the regioregular poly(3-octylthiophene) modified single wall carbon nanotube (7) (rrP3OT-SWNT).

FT-IR (KBr): ν (cm$^{-1}$) 2926, 2853

Photovoltaic Device Fabrication

The multifunctional materials of structures 1 and 2 will be used in photovoltaic devices having the structure:

What is claimed is:

1. A multifunctional material comprising the general structural formula:

wherein R is a substituent selected from the group consisting of alkyl, phenyl, pyridine, pyrimidine, ether or none and n is a number equal or greater than 1; and X is selected from the group or atom consisting of:

or oxygen (O); and
Y is selected from the group consisting of:

or none
where Q is selected from the group or atom consisting of hydrogen (H) or —CH$_3$ and m is a number equal or greater than 1; and
Z is selected from the group consisting of:
Z=—NH or none.

2. A process for preparing the multifunctional material of claim 1 wherein the process comprises reacting a monofunctionalized regioregular poly(3-substituted thiophene) with unmodified single wall or multi wall carbon nanotubes.

3. A process for preparing the multifunctional material of claim 1 wherein the process comprises reacting a monofunctionalized regioregular poly(3-substituted thiophene) with partial modified single wall or multi wall carbon nanotubes.

4. A process for preparing the multifunctional material of claim 1 wherein the process comprises reacting a monofunctionalized regioregular poly(3-substituted thiophene) with fully modified single wall or multi wall carbon nanotubes.

* * * * *